United States Patent [19]

Sehestedt

[11] 4,031,667
[45] June 28, 1977

[54] APPARATUS FOR CONTOURING EDGE OF SEMICONDUCTOR WAFERS

[75] Inventor: William H. Sehestedt, Santa Clara, Calif.

[73] Assignee: Macronetics, Inc., Sunnyvale, Calif.

[22] Filed: Mar. 29, 1976

[21] Appl. No.: 671,392

[52] U.S. Cl. .................... 51/105 R; 51/106 R
[51] Int. Cl.² .......................................... B24B 9/00
[58] Field of Search ............ 51/99, 101 LG, 105 R, 51/105 LG, 106 R, 106 LG, 283, 15 R; 198/19

[56] References Cited

UNITED STATES PATENTS

| | | | |
|---|---|---|---|
| 1,145,194 | 7/1915 | Hansen | 51/105 LG |
| 2,826,872 | 3/1958 | Robbins | 51/105 R |
| 3,274,736 | 9/1966 | Brokaw | 51/105 R |
| 3,332,172 | 7/1967 | Stern | 51/101 LG |
| 3,921,788 | 11/1975 | Roberson | 198/19 |
| 3,953,941 | 5/1976 | Kuhn | 51/15 R |

Primary Examiner—Al Lawrence Smith
Assistant Examiner—Nicholas P. Godici
Attorney, Agent, or Firm—Limbach, Limbach & Sutton

[57] ABSTRACT

Apparatus is provided for beveling or rounding the edge of thin, disc-like workpieces, such as silicon wafers integrated circuit masks and the like and includes a rotatable holder for receiving and releasably holding such a workpiece and rotating the workpiece with its edge free of obstruction. A rotating grinding wheel axially parallel to the workpiece and holder and having a V-shaped circumferential groove is urged against the edge of the workpiece by resilient biasing means so that the grinding wheel will be maintained in grinding engagement with the workpiece edge during the rotation of the workpiece.

10 Claims, 6 Drawing Figures

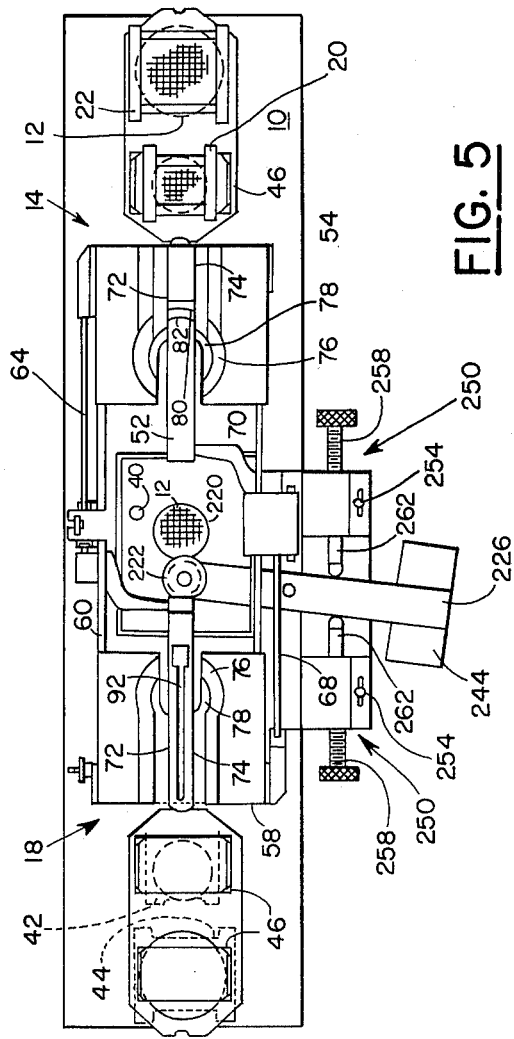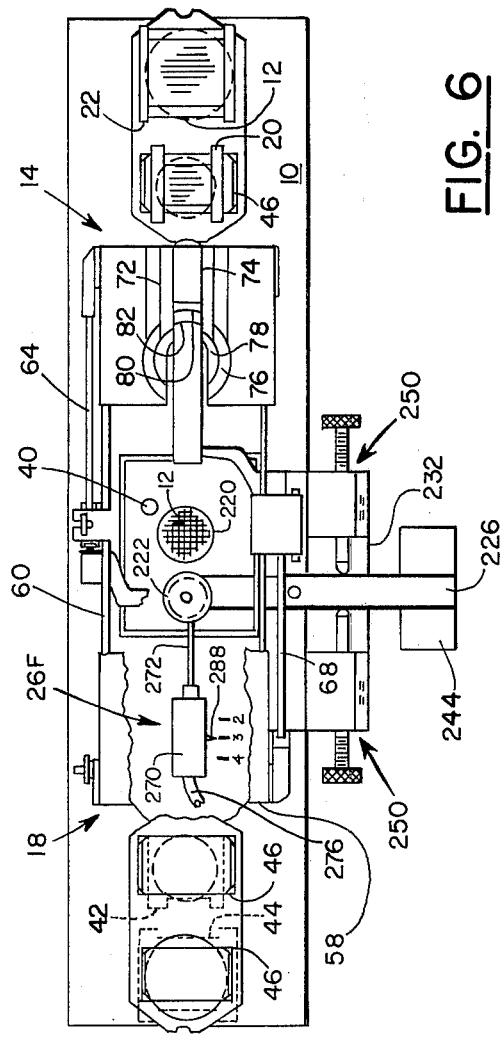

APPARATUS FOR CONTOURING EDGE OF SEMICONDUCTOR WAFERS

BACKGROUND OF THE INVENTION

The present invention relates to apparatus for contouring the edge of a thin, disc-like workpiece. More particularly, the present invention relates to apparatus for beveling or rounding any sharp corners adjacent the edge of such a workpiece.

In the field of semi-conductor device fabrication, two of the basic components are silicon wafers and photomasks. The silicon wafer forms the base upon which numerous other components are deposited, etched or formed by other well known techniques. This wafer, typically either two, three or four inches in diameter, is obtained by slicing an elongated bar of pure silicon, properly prepared, in a direction normal to the bar axis. Such wafers, generally between 0.015 and 0.030 inch thick, are very brittle and are susceptible to breakage during the numerous processing steps required to produce semi-conductor devices. The wafers are particularly susceptible to fracturing under the influence of stress raisers such as sharp corners and chips in the edge of the wafer. Breakage resulting from the presence of such stress raisers may result in the scrapping of a fully prepared wafer having hundreds of microcircuits formed thereupon, thus materially reducing the yield and increasing the cost of the component fabrication process.

Numerous attempts have been made to alleviate this problem of wafer breakage. These attempted solutions have addressed both the wafer handling techniques and also some attempts at rounding or beveling the edges of the wafer. The known apparatus heretofor used in such edge beveling attempts has generally comprised a fixed, chisel-like tool having a contoured end which is brought into contact with the edge of a rotating wafer, in a manner similar to a lathe-type turning process. Such apparatus has generally been unsatisfactory for several reasons, primarily relating to irregularities in the edge of the wafer or eccentricities in its rotation. The wafer edge irregularities result both from the method of growing the silicon bar from which the wafer is cut and also from the provision of a flat indexing area customarily cut into a portion of the otherwise generally circular periphery of the wafer. The presence of these irregularities has caused the contoured chisel-type devices both to miss the areas of the flat and to chatter when encountering such irregularities, thus possibly causing breakage of the wafer by the very contouring apparatus itself. Other disadvantages of the prior art apparatus include the necessity for a person operating the apparatus to align the wafer and the cutting tool precisely before each edge contouring operation, a time consuming process whose expense may compromise any economic benefits obtained by reduced wafer breakage.

SUMMARY OF THE INVENTION

It is therefore an object of the present invention to provide apparatus for contouring the edge of a thin, disc-like workpiece to bevel or round any sharp corners adjacent the edge of the workpiece.

It is a further object of the invention to provide apparatus for contouring the entire edge of such a workpiece, despite irregularities in the workpiece edge.

These and other objects of the invention are achieved by a provision of apparatus including rotatable holding means for receiving and releasably holding one side of such a thin, disc-like workpiece and rotating the workpiece generally about its center, the holding means gripping the workpiece side while leaving the edge of the workpiece free from obstruction. Additionally provided are contouring means for removing sharp corners from the edge of the workpiece, such contouring means comprising a rotating grinding wheel which is axially parallel to the rotatable holding means and is mounted for movement toward and away from the holding means and a workpiece held thereupon, such grinding wheel having a generally V-shaped, radially inwardly extending circumferential groove, the groove at the periphery of the grinding wheel being wider than the thickness of the work piece at its edge and tapering to a width at the radially innermost portion of the groove that is smaller than the workpiece edge thickness. Biasing means are also provided for resiliently urging the contouring means against the workpiece edge with a preselected force such that the grinding wheel will be maintained in grinding engagement with the workpiece edge during the entire rotation of the workpiece, whereby the entire edge of the workpiece may be beveled or rounded by rotation of the workpiece while in contact with the grinding wheel, the resiliently biased grinding wheel following any irregularities in the workpiece edge.

BRIEF DESCRIPTION OF THE DRAWINGS

The invention will be described in conjunction with the following illustrations in which:

FIG. 5 is a plan view of the combination of the apparatus of FIG. 1 and an automatic workpiece transporting apparatus, with the contour wheel illustrated in grinding contact with a workpiece; and FIG. 6 is a plan view of the apparatus of FIG. 5 with the contour wheel illustrated in its retracted position.

DESCRIPTION OF A PREFERRED EMBODIMENT

A preferred embodiment of the present invention will be described first with respect to the basic components thereof and then in combination with the processing apparatus for thin, disc-like workpieces disclosed in U.S. Pat. No. 3,921,788 to Roberson Jr. et al, the combination constituting an improvement to the apparatus disclosed therein and providing an entirely new function and method of operation therefor. Accordingly, the entire disclosure of U.S. Pat. No. 3,921,788 is hereby incorporated by reference, with the reference numbers 1 through 208 inclusive of FIGS. 4, 5, and 6, corresponding to the same reference numbers used in that patent, whether discussed herein or not.

Figure 1:
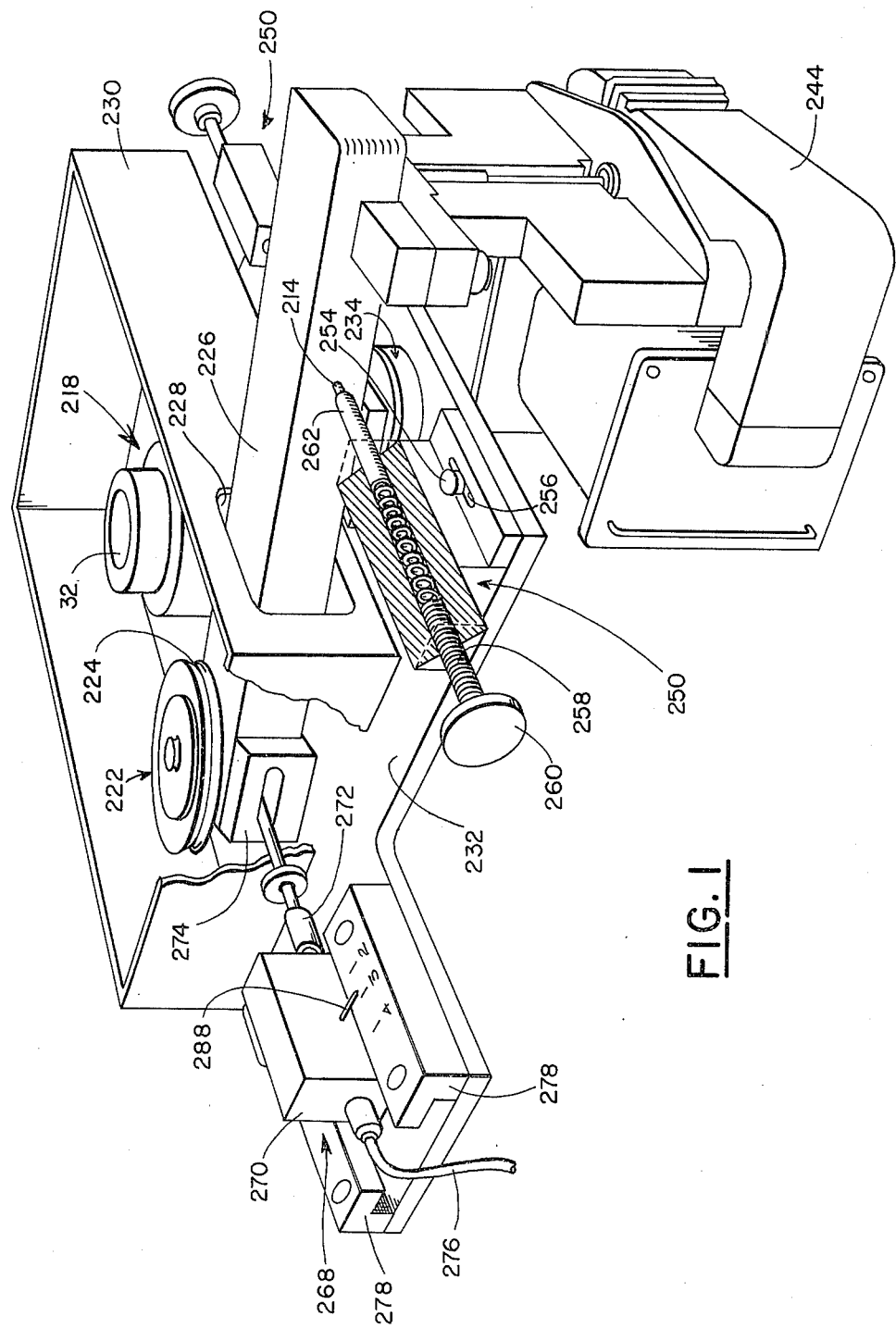
FIG. 1 is a perspective view of the basic components of the apparatus of this invention.
Figure 2:
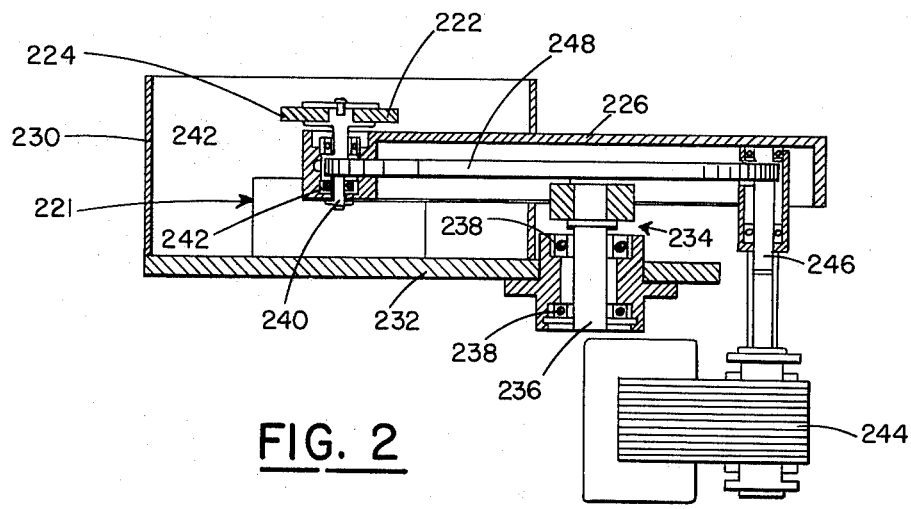
FIG. 2 is an elevational view in section of the structure of FIG. 1, taken through the center of the pivot arm.
Figure 3:
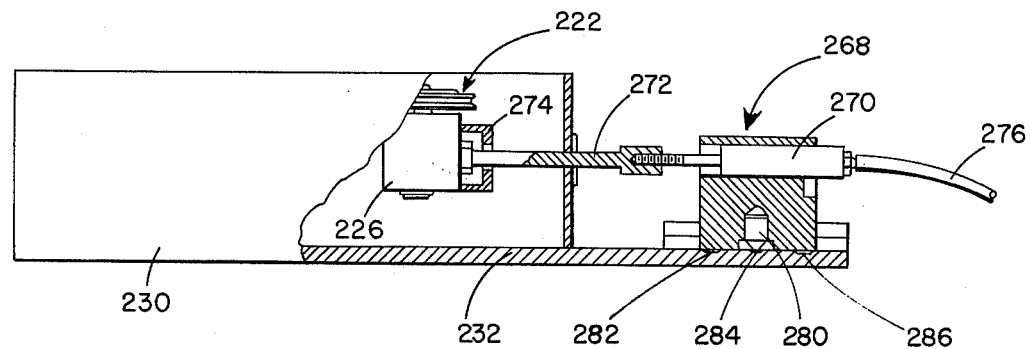
FIG. 3 is a side elevational view of the apparatus of FIG. 1 taken through the center of the retracting assembly.
Figure 4:
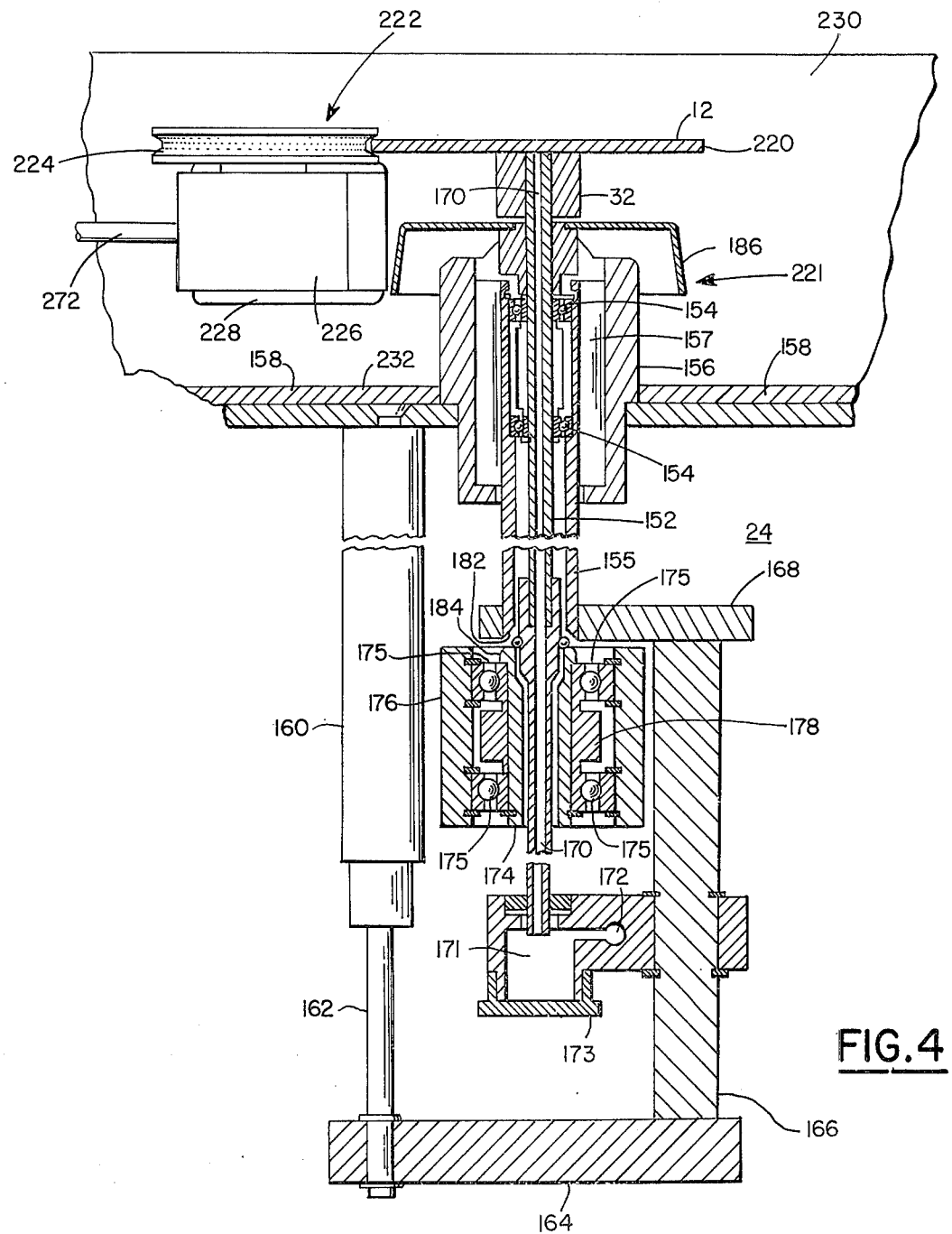
FIG. 4 is an elevational view of a portion of the apparatus of FIG. 1 illustrating the work holding mechanism in section.

The workpiece edge contouring apparatus of this invention comprises, basically, the assembly illustrated in FIGS. 1, 2, and 3. Preferably, this assembly is combined with the workpiece processing apparatus of U.S. Pat. No. 3,921,788, referenced above, as illustrated in FIGS. 4, 5 and 6. Such a combination provides for a desirable, fully automatic workpiece handling and edge contouring operation. In this disclosed preferred embodiment, the workpiece to be processed may suitably be a silicon wafer such as used in the manufacture of semi-conductor devices. Such a wafer typically is either 2, 3 or 4 inches in diameter and is of a predetermined thickness, generally in the range of 0.015 to 0.030 inch. A similar type of workpiece also well suited for edge contouring on this apparatus is the thin, wafer-like photomask used for preparation of the photo-resistive circuitry pattern on such silicon wafers.

The components of the edge contouring apparatus of this invention are most clearly illustrated in the pictorial view of FIG. 1 and the side views of FIGS. 2, 3 and 4. In this apparatus a rotatable work holder 218 such as vacuum chuck 32 is provided for receiving and releasably holding one side of a wafer 12, as illustrated in FIG. 4. By gripping the wafer 12, which is generally centered with respect to the axis of rotation of the work holder, on its side, the edge 220 of the wafer is kept free from obstruction so that it may be contoured as described below. Conventional means, such as an electric motor, may be used for rotating the work holder 218 and the wafer 12 held thereupon.

The preferred edge contouring tool is a diamond gritted grinding wheel 222. This grinding wheel, which may suitably have a diameter of approximately 1½ inches, includes a generally V-shaped circumferential groove 224 which extends radially inwardly and is coated with a suitable abrasive such as diamond grit having a courseness of about a 500 grit. As shown in FIG. 4, this generally V-shaped groove is slightly wider at the periphery of the wheel than the edge thickness of the wafer 12 to be processed and tapers to a width at the innermost end of the groove that is slightly smaller than the edge thickness of the wafer. The base of this groove preferably is given a slight radius. The grinding wheel 222 is rotatably mounted on a pivot arm 226 which extends through an opening 228 in the side of enclosure 230. This arm 226 is attached to base plate 232 by pivotal mounting 234, which includes shaft 236 affixed to arm 226 and rotatably received into bearings 238 rigidly mounted to base plate 232. This pivotal mounting of arm 226 provides for movement of the contouring wheel 222 toward and away from the work holder 218 and the wafer 12 gripped by the chuck 32 of that work holder.

As best illustrated in the sectional view of FIG. 2, the contouring wheel 222 is rotatably attached to arm 226 by an axial shaft 240 affixed to the contouring wheel and which is rotatably received into bearings 242 affixed to arm 226. Mounted to the opposite end of arm 226 is contouring wheel drive motor 244, the shaft 246 of which is connected by a flexible dirve belt 248 to the shaft 240 of the contouring wheel. For this embodiment of the invention, a drive motor and belting arrangement rotating the contouring wheel 222 at a speed of 2500 to 3000 revolutions per minute has been found satisfactory, although a broad range of speeds, preferably between 2000 and 5000 revolutions per minute, appears to provide equally satisfactory results.

To urge the arm 226 and thus the contouring wheel 222 against the wafer edge 220, a pair of adjustable, spring-loaded biasing assemblies 250 act against the sides of arm 226. These opposed biasing assemblies resiliently urge the arm 226 and its contouring wheel 222 toward a predetermined position, as described below, and exert an adjustable, predetermined force against displacement of the arm and contouring wheel either side of that position. Each of these biasing plunger assemblies 250 is of similar structure, with the components thereof illustrated in the broken out section in FIG. 1. The assembly 250 comprises a housing 252 which is adjustably mounted by cap screws 254 extending through elongated slots 256 in the housing 252 and threadedly received into base plate 232. This slotted mounting provides for longitudinal adjustment of the position of the biasing assembly 250 for reasons to be described below. A member such as adjusting screw 258 having a knurled knob 260 at one end thereof, is threadedly received into one end of housing 252. Coaxial with screw 258 and slidably received into the opposite end of housing 252 is biasing plunger 262 having a low friction plastic cap 264 at its outermost end for bearing against the side of pivot arm 226. Extending between the respective innermost ends of screw 258 and plunger shaft 262 is a coil-type compression spring 266, resiliently urging plunger shaft 262 against arm 226. By threading the adjusting screw 258 inwardly or outwardly of the biasing unit housing 252, the compression of the spring 266, and thus the force it exerts upon plunger 262, may be adjusted. Preferably, the opposing forces exerted by the two opposed biasing assemblies 250 are adjusted to urge the contouring wheel 222 against the edge of the wafer with sufficient force to maintain the grinding wheel in light grinding engagement with the wafer during its rotation by the work holder 221. Thus, this resilient biasing arrangement will enable the contouring grinding wheel 222 to follow any irregularities in the edge of the wafer being processed, including the indexing flat customarily provided, without chattering.

Since the biasing assemblies 250 urge the contouring wheel 222 against the edge 220 of the wafer 12, as illustrated in FIGS. 4 and 5, it is desirable to provide some means for retracting contouring wheel away from the work holder 218 to facilitate loading and unloading of successive wafers onto the work holder 218. Suitable apparatus for retracting the contouring wheel is generally indicated by reference number 268 in FIGS. 1, 3 and 6. This retracting assembly 268 comprises essentially a vacuum cylinder 270 longitudinally actuating a plunger affixed to one end of retracting shaft 272. The opposite end of retracting shaft 272 is attached to pivot arm 226 adjacent contouring wheel 222, the attachment providing for limited pivotal and longitudinal play of the shaft within its attachment 274 to the arm 226. When a vacuum is applied (from a conventional source not illustrated) to cylinder 270 through tubing 276, the plunger and shaft 272 are withdrawn into the cylinder 270, thus retracting the pivot arm and contour wheel 222 to a position remote from work holder 218, as illustrated in FIGS. 1 and 6. When the vacuum is released from cylinder 270, the arm is pivoted under the influence of the biasing assemblies 250 to its preselected position with the contouring wheel 222 engaging the edge of a wafer 12 to be processed.

In this preferred embodiment the entire retracting assembly 268 is slidably mounted to base plate 232 by mounting structure 278. This arrangement provides for longitudinal adjustment of the entire retracting assembly to adjust the retracted position suitably to compensate for different diameters of wafers to be processed.

Since the most common wafer diameters are 2, 3 and 4 inches, the retracting assembly is provided with a spring loaded bullet 280 which may selectively and alternatively be brought into engagement with either of detents 282, 284 or 286 in base plate 232. These detents 282, 284 and 286, respectively, locate the retracting assembly 268 in positions appropriate for wafers of 2, 3 and 4-inch diameters. As illustrated in FIGS. 1 and 6, location marks may be provided on retracting assembly mount 278 to cooperate with an indicator 288 attached to the body of retracting assembly 268. Thus, by aligning the indicator with the appropriate location mark, the retracting apparatus may easily be set for proper positioning for any of the preselected wafer diameters.

To adjust the contouring wheel biasing assemblies 250 for different wafer diameters, two methods are provided. Either the entire assemblies may be adjusted by releasing cap screws 254 and sliding the respective assemblies as provided by the elongated slot 256 or the respective tension adjusting screws 258 may be readjusted. These tension adjusting screws 258 may also be adjusted to vary the pressure of the grinding wheel 222 against the edge of the wafer to adjust the apparatus between very light contouring of the wafer edge, at one setting, and heavy grinding of the edge for either fast cutting or for reduction of the wafer diameter, at another setting.

To achieve uniformity of edge contouring on successive wafers processed by the apparatus of this invention, it is desirable that some means be provided for controlling the amount of material removed from the wafer edge by the contouring wheel 222. This control may be achieved either by varying the pressure of the contouring wheel 222 against the wafer edge, as described above, or by varying and controlling the length of time the contouring wheel 222 is held in grinding contact with the wafer edge, or by some combination of these two methods. The duration of grinding engagement between the contouring wheel 222 and the wafer edge may readily be controlled by a conventional, selectively settable timer (not shown) controlling a valve (not shown) which applies and releases the vacuum to the vacuum chamber 270 of retracting assembly 268, thus selectively controlling the time that contouring wheel 222 is allowed to engage the edge of the wafer 12 which is rotating preferably at a constant speed, suitably three or four revolutions per minute.

The apparatus of this invention has been described principally in reference to FIGS. 1, 2 and 3, which illustrate the basic components of the apparatus. This basic form of the apparatus is quite suitable for edge contouring of wafers that are loaded onto the work holder 221 and removed therefrom by hand. However, another particularly desirable embodiment of the apparatus of this invention is illustrated in FIGS. 4, 5 and 6. In these figures, the apparatus of this invention is combined with the wafer processing apparatus of U.S. Pat. No. 3,921,788 to Roberson et al. By the combination of the apparatus of this invention with that of the Roberson et al patent, a fully automatic wafer edge contouring operation may be obtained. As described in that patent, apparatus is provided for transferring wafers to be processed from a supply station to a rotatable work holder, where the processing (in this case, edge contouring) is performed, and thence to a receiving station. Suitably, the supply station comprised a supply receptacle 20 which holds a plurality of unprocessed workpieces for sequential dispensing to the adjacent transfer or transport mechanism 14. Thus, individual wafers may be automatically, sequentially transferred from this supply receptacle 20 to the work holder for processing, the supply transfer mechanism 14 also including apparatus for centering the wafers with respect to the work holder axis of rotation. Similarly, a receiving receptacle 42 is provided adjacent the transfer mechanism 18 which removes the edge-contoured wafer after its release from the work holder. This receiving receptacle 42 thus receives and stores, pending further processing, the wafers which have been edge-contoured and then removed from the work holder by the receiving transfer mechanism 18. It may be noted that FIG. 5 depicts the pivot arm 226 and contouring wheel 222 in their positions of grinding engagement with the edge 220 of wafer 12 held upon the rotating work holder hidden below the wafer. FIG. 6 depicts the arm 226 and contour wheel 222 in the retracted position, with a portion of the receiving transport or transfer mechanism 18 broken away to show the retracting assembly 268. The rotatable work holder of this embodiment is illustrated in more detail in FIG. 4. Again, it is to be noted that the reference numerals 1 through 208 of FIGS. 4, 5 and 6 correspond to the same reference numerals found in U.S. Pat. No. 3,921,788, which includes a complete description of the structures referenced thereby.

The general manner of operation of the apparatus of this invention, whether manually loaded and unloaded or automatically operated as with the embodiments of FIGS. 4, 5 and 6, is generally as follows. With the edge contouring wheel 222 and pivot arm 226 in their retracted position, a wafer 12 to be edge-contoured is centered upon and gripped by work holder 218. This wafer loading step may be accomplished either manually or automatically by the transport and transfer apparatus of FIGS. 5 and 6. Then the rotation of work holder 218 and wafer 12 centered thereupon is begun. Drive motor 244 is then energized to rotate contouring wheel 222. Shortly thereafter the vacuum applied to retracting assembly 268 is released, permitting its plunger and shaft 272 to be withdrawn from the vacuum cylinder 270, thus to allow pivot arm 226 to pivot clockwise toward the work holder 218. The pivot arm biasing assemblies 250, having been previously adjusted, resiliently urge this pivoting movement of arm 226 to bring rotating contouring wheel 222 into grinding engagement with the edge 220 of slowly rotating wafer 12. The opposing biasing forces exerted by the plungers 262 of biasing assemblies 250 are adjusted to urge the contour wheel toward a position radially inwardly of the edge of the wafer 12 in order that the contour wheel will be biased to follow any irregularities in the generally circular periphery of the wafer. The rotation of the wafer 12 with its grinding engagement with contour wheel 222 in maintained for a predetermined period of time set into the control mechanism. At the end of the preselected processing time, vacuum is reapplied to the cylinder 270 of retracting assembly 268, thus retracting the arm 226 and contour wheel 222 away from engagement with the wafer 12. At this time, if desired, the surface of the wafer may be flushed with a solvent and dried with a jet of air, in a conventional and well known manner not illustrated. Subsequently, the wafer is released from the work holder 218 and removed, either manually or by automatic transferring structure 18, thus freeing the work holder 218 for receipt and edge-contouring of a subsequent wafer.

While a preferred embodiment of the apparatus of this invention has been described in detail for contouring the edge of a semi-conductor wafer, either beveling or rounding the edge, the invention is obviously suitable to numerous other applications involving the contouring of the edge of other thin, generally disc-like workpieces. Additionally, numerous other features and advantages of the apparatus of this invention will become apparent to those skilled in the art. Accordingly, the foregoing description of a preferred embodiment is to be considered only as illustrative of the principles of the invention and is not to be limitative thereof, the invention being defined solely by the claims appended hereto.

I claim:

1. Apparatus for contouring the edge of a semiconductor wafer, comprising rotatable holding means for receiving and releasably holding one side of said wafer while leaving the edge of said wafer free from obstruction, and rotating said wafer generally about its center, contouring means for removing sharp corners from the edge of said wafer, said contouring means comprising a rotating grinding wheel which is axially parallel to said rotating holding means and is mounted for movement toward and away from said holding means and a wafer held thereupon, said grinding wheel having a generally V-shaped, radially inwardly extending circumferential groove, whereby engagement between the edge of the rotating workpiece and the grinding wheel groove may serve to bevel or round any sharp corners adjacent the edge of the workpiece, biasing means resiliently urging said contouring means against said wafer edge with a preselected and adjustable force such that said grinding wheel will be maintained in grinding engagement with said wafer edge during the entire rotation of said wafer, said resilient biasing means comprising a pair of coil springs each having one end connected to said contouring means and the other end connected to a mount which is adjustably movable longitudinally of its respective coil spring, said coil springs and mounts opposing one another, whereby said opposed springs and mounts may serve to urge said contouring means to an adjustable predetermined position and to exert an adjustable, predetermined force against displacement of said contouring means either side of said predetermined position.

2. Edge contouring apparatus according to claim 1 wherein said predetermined position is radially inwardly of the edge of a workpiece held by said rotatable work holding means.

3. Edge contouring apparatus according to claim 2 further comprising means for adjusting said predetermined position to compensate for different workpiece diameters.

4. Edge contouring apparatus according to claim 1 further comprising retracting means for selectively holding said contouring means in a retracted position away from said workpiece edge engaging position when said wafer is being loaded onto or removed from said rotatable work holding means.

5. Edge contouring apparatus according to claim 4 further comprising means for adjusting said retracted position to compensate for different wafer diameters.

6. Edge contouring apparatus according to claim 1 further comprising presettable control means for automatically controlling the amount of material to be removed from said wafer by said contouring means.

7. Edge contouring apparatus according to claim 1 further comprising means for automatically transferring said wafer from a supply station to said work holding means, said supply transferring means including means for automatically centering said wafer with respect to the axis of rotation of said work holding means, whereby rotation of said work holding means may serve to rotate said wafer generally about its center.

8. Edge contouring apparatus according to claim 7 further comprising a supply receptacle for holding for sequential dispensing a plurality of said wafers to be edge contoured, said supply receptacle being positioned adjacent said supply transferring means for supplying individual said wafers sequentially thereto, whereby said supply transferring means may automatically and sequentially transfer individual said wafers from said supply receptacle to said work holding means for edge contouring.

9. Edge contouring apparatus according to claim 7 further comprising means for automatically transferring said wafer from said work holding means to a receiving station after completion of edge contouring and release of said wafer by said holding means and prior to transfer of any subsequent wafer from said supply station to said work holding means, whereby said work holding means may be automatically cleared for receiving and holding a subsequent said wafer for edge contouring.

10. Edge contouring apparatus according to claim 9 further comprising a receptacle for receiving a plurality of said edge contoured wafers, said receiving receptacle being positioned adjacent said receiving station transferring means for receiving said wafers being transferred from said work holding means, whereby said receiving receptacle may receive and store a plurality of said wafers which have been edge contoured by said apparatus.

* * * * *